(12) United States Patent
Cho et al.

(10) Patent No.: US 12,243,966 B2
(45) Date of Patent: Mar. 4, 2025

(54) LIGHT-EMITTING DEVICE

(71) Applicant: EPISTAR CORPORATION, Hsinchu (TW)

(72) Inventors: Heng-Ying Cho, Hsinchu (TW); Li-Yu Shen, Hsinchu (TW); Chih-Hao Chen, Hsinchu (TW); Keng-Lin Chuang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 926 days.

(21) Appl. No.: 17/354,922

(22) Filed: Jun. 22, 2021

(65) Prior Publication Data

US 2021/0408338 A1   Dec. 30, 2021

(30) Foreign Application Priority Data

Jun. 24, 2020 (TW) .................................. 109121677
May 25, 2021 (TW) .................................. 110118787

(51) Int. Cl.
| | |
|---|---|
| *H01L 33/44* | (2010.01) |
| *H01L 27/15* | (2006.01) |
| *H01L 33/02* | (2010.01) |
| *H01L 33/10* | (2010.01) |
| *H01L 33/58* | (2010.01) |

(52) U.S. Cl.
CPC .............. *H01L 33/44* (2013.01); *H01L 33/10* (2013.01)

(58) Field of Classification Search
CPC ......... H01L 33/10; H01L 33/44; H01L 33/46; H01L 33/58; H01L 33/62
See application file for complete search history.

(56) References Cited

U.S. PATENT DOCUMENTS

| | | | |
|---|---|---|---|
| 2011/0127549 A1* | 6/2011 | Lee .......................... | H01L 33/06 |
| | | | 257/E33.074 |
| 2017/0108937 A1* | 4/2017 | Kim ....................... | G06F 1/1662 |
| 2017/0279008 A1* | 9/2017 | You ....................... | H01L 33/0093 |
| 2018/0301865 A1* | 10/2018 | Burroughs ............ | H01S 5/0028 |
| 2019/0371967 A1* | 12/2019 | Kim ......................... | H01L 33/32 |
| 2020/0227581 A1* | 7/2020 | Wu ....................... | H01L 31/0336 |
| 2020/0235267 A1* | 7/2020 | Cho ..................... | H01L 25/0756 |
| 2021/0343906 A1* | 11/2021 | Wang ..................... | H01L 33/46 |
| 2022/0406969 A1* | 12/2022 | Hong ..................... | H01L 33/38 |
| 2023/0081600 A1* | 3/2023 | Huang .................. | H01L 23/544 |

* cited by examiner

*Primary Examiner* — Mohsen Ahmadi
(74) *Attorney, Agent, or Firm* — Patterson + Sheridan, LLP (57) ABSTRACT

A light-emitting device comprises a semiconductor stack emitting a light with a peak wavelength λ; and a light field adjustment layer formed on the semiconductor stack, wherein the light field adjustment layer comprises a plurality of first layers and a plurality of second layers alternately stacked on top of each other, the plurality of first layers each comprises a first optical thickness, and the plurality of second layers each comprises a second optical thickness.

15 Claims, 9 Drawing Sheets

LIGHT-EMITTING DEVICE

REFERENCE TO RELATED APPLICATION

This application claims the right of priority based on TW Application Serial No. 110118787, filed on May 25, 2021 and TW Application Serial No. 109121677, filed on Jun. 24, 2020, and the contents of which are hereby incorporated by references in its entireties.

TECHNICAL FIELD

The application relates to a light-emitting device, and more particularly, to a light-emitting device comprising a light field adjustment layer

DESCRIPTION OF BACKGROUND ART

Light-Emitting Diode (LED) is a solid-state semiconductor light-emitting device, which has the advantages of low power consumption, low heat generation, long working lifetime, shockproof, small volume, fast reaction speed and good photoelectric property, such as stable emission wavelength. Therefore, the light-emitting diodes are widely used in the household appliances, the equipment indicators, and the optoelectronic products.

SUMMARY OF THE APPLICATION

In accordance with an embodiment of the present application, a light-emitting device comprises a semiconductor stack emitting a light with a peak wavelength k; and a light field adjustment layer formed on the semiconductor stack, wherein the light field adjustment layer comprises a plurality of first layers and a plurality of second layers alternately stacked on top of each other, the plurality of first layers each comprises a first optical thickness, and the plurality of second layers each comprises a second optical thickness, wherein the first optical thickness and the second optical thickness meet any one of the following: the first optical thickness is less than $0.25\lambda$, and the second optical thickness is larger than or approximately equal to $0.25\lambda$, the first optical thickness is equal to $0.25\lambda$, and the second optical thickness is less than or larger than $0.25\lambda$, or the first optical thickness is larger than $0.25\lambda$, and the second optical thickness is less than or approximately equal to $0.25\lambda$.

DETAILED DESCRIPTION OF PREFERRED EMBODIMENTS

The embodiment of the application is illustrated in detail, and is plotted in the drawings. The same or the similar part is illustrated in the drawings and the specification with the same number.

Figure 1:
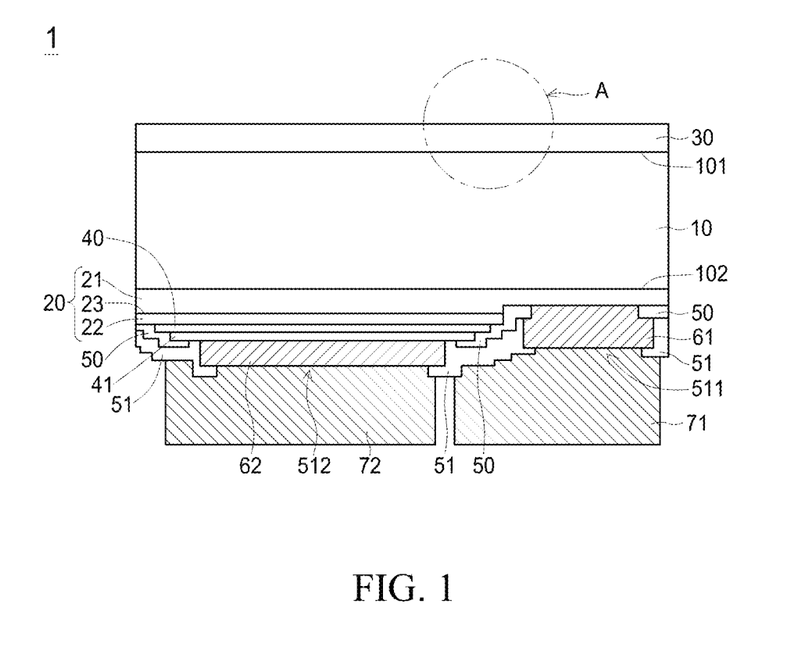
FIG. 1 illustrates a side view of a light-emitting device 1 in accordance with an embodiment of the present application.
Figure 2:
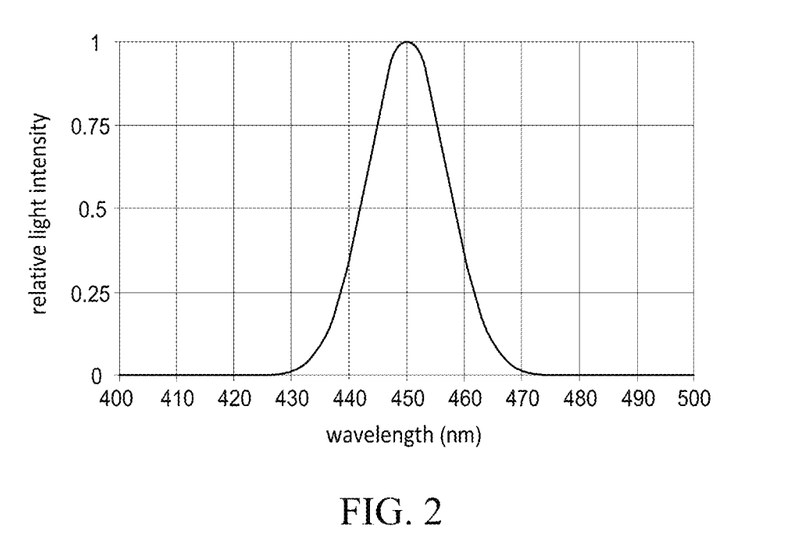
FIG. 2 illustrates an emission spectrum of the light-emitting device 1 in accordance with an embodiment of the present application.
Figure 3A:
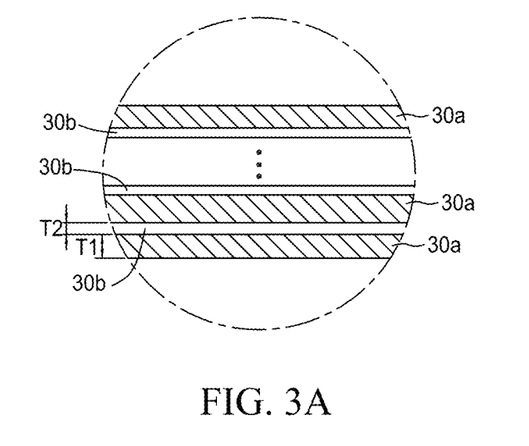
FIG. 3A illustrates a partial enlarged view of the area A in FIG. 1 in accordance with an embodiment of the present application.
Figure 3B:
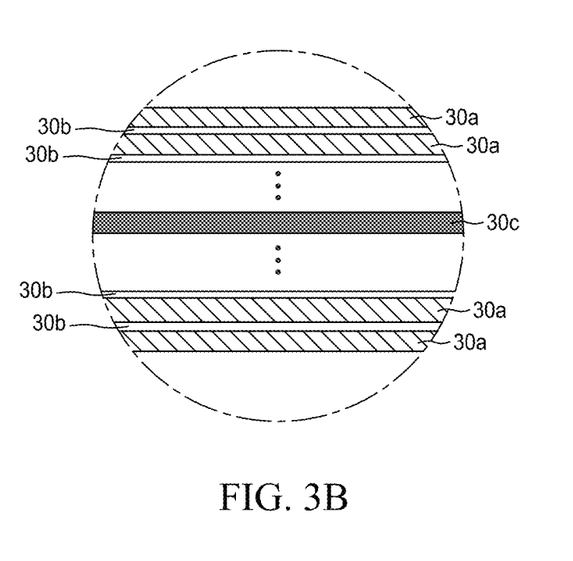
FIG. 3B illustrates a partial enlarged view of the area A in FIG. 1 in accordance with an embodiment of the present application.

FIG. 1 illustrates a side view of a light-emitting device 1 in accordance with an embodiment of the present application. FIG. 2 illustrates an emission spectrum of the light-emitting device 1 in accordance with an embodiment of the present application. FIG. 3A illustrates a partial enlarged view of the area A in FIG. 1 in accordance with an embodiment of the present application. FIG. 3B illustrates a partial enlarged view of the area A in FIG. 1 in accordance with another embodiment of the present application.

As shown in FIG. 1, a light-emitting device 1 comprises a substrate 10; a semiconductor stack 20 formed on the substrate 10 comprising a first semiconductor layer 21, a second semiconductor layer 22, and an active layer 23 formed between the first semiconductor layer 21 and the second semiconductor layer 22; a transparent conductive layer 40 formed on the semiconductor stack 20; a protective layer 50 covering the semiconductor stack 20; and a light field adjustment layer 30 formed on a side adjacent to the substrate 10 or a side adjacent to the semiconductor stack 20 (not shown).

The substrate 10 comprises an insulating substrate or a conductive substrate. The substrate 10 can be a growth substrate for the epitaxial growth of the semiconductor stack 20. The substrate 10 comprises gallium arsenide (GaAs) wafer for epitaxially growing aluminum gallium indium phosphide (AlGaInP), or silicon (Si) wafer, sapphire ($Al_2O_3$) wafer, gallium nitride (GaN) wafer, silicon carbide (SiC) wafer, or aluminum nitride (AlN) wafer for epitaxially growing gallium nitride series materials, such as gallium nitride (GaN), indium gallium nitride (InGaN), aluminum indium gallium nitride (AlInGaN), or aluminum gallium nitride (AlGaN). The substrate 10 comprises a thickness within a range between 50 µm~250 µm, preferably between 80 µm~200 µm, more preferably between 100 µm~150 µm.

The substrate 10 comprises a first surface 101 and a second surface 102. In the embodiment, the first surface 101 is the main light emitting surface of the light-emitting device 1. The light field adjustment layer 30 is disposed on the first surface 101 of the substrate 10, which selectively reflects a portion of the light comprising a peak wavelength λ, emitted from the semiconductor stack 20 and allows another portion of the light to penetrate thereof. The light transmittance is varied with the incident angle of the light to adjust the light field distribution of the light-emitting device 1. As shown in FIG. 2, the semiconductor stack 20 of the light-emitting device 1 emits a light comprising a wavelength between 430 nm and 470 nm, wherein the peak wavelength λ, is the maximum wavelength of the relative light intensity, for example, 450 nm.

The substrate 10 is connected to the semiconductor stack 20 by the second surface 102. The second surface 102 comprises a roughened surface. The roughened surface comprises a surface with an irregular morphology or a surface with a regular morphology. For example, with respect to the second surface 102, the substrate 10 comprises one or more convex portions (not shown) protruding from the second surface 102, or comprises one or more concave portions (not shown) recessed in the second surface 102. In a cross-sectional view, the convex portion (not shown) or the concave portion (not shown) comprises a semicircular shape or a polygonal shape.

In an embodiment of the present application, the metal organic chemical vapor deposition (MOCVD), molecular beam epitaxy (MBE), hydride vapor phase epitaxy (HVPE), physical vapor deposition (PVD), or ion plating method is provided to form the semiconductor stack 20 with photo-electrical characteristics on the substrate 10, such as a light-emitting stack, wherein the physical vapor deposition method comprises sputtering or evaporation.

The semiconductor stack 20 comprises the first semiconductor layer 21, the second semiconductor layer 22, and the active layer 23 formed between the first semiconductor layer 21 and the second semiconductor layer 22. The wavelength of the light emitted from the light-emitting device 1 is adjusted by changing the physical and chemical composition of one or more layers in the semiconductor stack 20. The material of the semiconductor stack 20 comprises III-V group semiconductor materials, such as $Al_xIn_yGa_{(1-x-y)}N$, $Al_xGa_{(1-x)}As$ or $Al_xIn_yGa_{(1-x-y)}P$, where $0 \leq x$, $y \leq 1$; $(x+y) \leq 1$. When the material of the semiconductor stack 20 comprises AlGaAs or AlInGaP series material, the red light having a wavelength between 610 nm and 650 nm or the green light having a wavelength between 530 nm and 570 nm can be emitted. When the material of the semiconductor stack 20 comprises InGaN series material, the blue or deep blue light having a wavelength between 400 nm and 490 nm or the green light having a wavelength between 490 nm and 550 nm can be emitted. When the material of the semiconductor stack 20 comprises AlGaN series or AlInGaN series material, the ultraviolet light having a wavelength between 250 nm and 400 nm can be emitted.

The first semiconductor layer 21 and the second semiconductor layer 22 can be confinement layers having different conductivity types, electrical properties, polarities, or doping elements for providing electrons or holes. For example, the first semiconductor layer 21 is an n-type semiconductor and the second semiconductor layer 22 is a p-type semiconductor. The active layer 23 is formed between the first semiconductor layer 21 and the second semiconductor layer 22. The electrons and the holes combine in the active layer 23 under a current driving to convert the electrical energy into the light energy and then the light is emitted from the active layer 23. The active layer 23 can be a single heterostructure (SH), a double heterostructure (DH), a double-side double heterostructure (DDH), or a multi-quantum well structure (MQW). The material of the active layer 23 can be i-type, p-type, or n-type semiconductor. The first semiconductor layer 21, the second semiconductor layer 22, or the active layer 23 can be a single layer or a structure comprising a plurality of sub-layers.

In an embodiment of the present application, the semiconductor stack 20 further comprises a buffer layer (not shown) formed between the first semiconductor layer 21 and the substrate 10 which can release the stress caused by lattice mismatch between the materials of the substrate 10 and the semiconductor stack 20 so the lattice dislocation and the lattice defect are reduced and the epitaxial quality of the semiconductor stack 20 is improved. The buffer layer comprises a single layer or a structure comprising a plurality of sub-layers. In an embodiment, an aluminum nitride (AlN) layer formed by PVD method can be the buffer layer located between the semiconductor stack 20 and the substrate 10 to improve the epitaxial quality of the semiconductor stack 20. In an embodiment, when the method for forming aluminum nitride (AlN) is PVD, the target can be made of aluminum nitride. In another embodiment, a target made of aluminum reacts with a nitrogen source to form the aluminum nitride.

In order to reduce the contact resistance and improve the current spreading efficiency, the light-emitting device 1 comprises a transparent conductive layer 40 formed on the second semiconductor layer 22. The material of the transparent conductive layer 40 comprises a metal material with a thickness smaller than 500 Å or a transparent conductive oxide. The metal material comprises chromium (Cr), titanium (Ti), tungsten (W), gold (Au), aluminum (Al), indium (In), tin (Sn), nickel (Ni), platinum (Pt), or an alloy of the above materials. The transparent conductive oxide comprises indium tin oxide (ITO) or indium zinc oxide (IZO).

The light-emitting device 1 comprises a first electrode 61 and a second electrode 62 formed on the same side of the semiconductor stack 20. The light-emitting device 1 can be a flip chip structure or a lateral chip structure. When the light-emitting device 1 comprises a flip-chip structure, as shown in FIG. 1, the light field adjustment layer 30 is disposed on the first surface 101 of the substrate 10. When the light-emitting device 1 comprises a lateral chip structure, the light field adjustment layer 30 is disposed on the semiconductor stack 20, for example, between the semiconductor stack 20 and the first electrode 61, the second electrode 62 (not shown). The light field adjustment layer 30 is disposed on the main light emitting surface of the light-emitting device 1 to adjust the light field distribution of the light-emitting device 1 by adjusting the reflectivity and the transmittance of the light emitted toward the main light emitting surface.

When the light-emitting device 1 comprises a flip chip structure, as shown in FIG. 1, in order to increase the light extraction efficiency of the light-emitting device 1, the light-emitting device 1 comprises a reflective layer 41 to reflect the light emitted from the active layer 23 of the semiconductor stack 20 and direct the light toward the substrate 10. The reflective layer 41 comprises a metal reflective layer or an insulating reflective structure. When the reflective layer 41 comprises the metal reflective layer, the metal reflective layer comprises a metal such as aluminum (Al), silver (Ag), rhodium (Rh), platinum (Pt), or an alloy of the above materials. In an embodiment, in order to avoid the surface oxidation of the metal reflective layer, thereby degrading the reflectivity of the metal reflective layer, a barrier layer (not shown) can be formed on the metal reflective layer to cover the upper surface and the side surface of the metal reflective layer. The material of the barrier layer (not shown) comprises metal materials, such as titanium (Ti), tungsten (W), aluminum (Al), indium (In), tin (Sn), nickel (Ni), chromium (Cr), platinum (Pt), or an alloy of the above materials. The barrier layer can be a single layer or comprises a plurality of sub-layers, and the plurality of sub-layers comprises titanium (Ti)/aluminum (Al), and/or nickel-titanium alloy (NiTi)/titanium-tungsten alloy (TiW). When the reflective layer 41 comprises the insulating reflective structure, the insulating reflective structure comprises two or more insulating materials with different refractive indexes alternately stacked to form a Distributed Bragg Reflector (DBR) structure. In an embodiment of the present application, when the reflective layer 41 comprises the insulating reflective structure, the insulating reflective structure comprises one or a plurality of openings (not shown), the second electrode 62 is electrically connected to the transparent conductive layer 40 through the one or the plurality openings of the insulating reflective structure. In an embodiment of the present application, the second electrode 62 comprises a reflective metal material, which can be combined with the insulating reflective structure to form an Omni-Directional Reflection.

In an embodiment of the present application, when the light-emitting device 1 comprises the lateral chip structure, the reflective layer 41 can be disposed on the first surface 101 of the substrate 10.

In an embodiment of the present application, the light-emitting device 1 comprises an insulating layer 51 formed on the first electrode 61 and the second electrode 62; a first electrode pad 71 formed on the insulating layer 51; and a second electrode pad 72 formed on the insulating layer 51. The insulating layer 51 comprises a first insulating layer opening 511 to expose the first electrode 61 and a second insulating layer opening 512 to expose the second electrode 62. The first electrode pad 71 contacts the first electrode 61 through the first insulating layer opening 511 and is electrically connected to the first semiconductor layer 21. The second electrode pad 72 contacts the second electrode 62 through the second insulating layer opening 512 and is electrically connected to the second semiconductor layer 22.

The first electrode 61, the second electrode 62, the first electrode pad 71, and the second electrode pad 72 comprise a metal material, such as chromium (Cr), titanium (Ti), tungsten (W), gold (Au), aluminum (Al), indium (In), tin (Sn), nickel (Ni), platinum (Pt), or an alloy of the above materials. The first electrode 61, the second electrode 62, the first electrode pad 71, and the second electrode pad 72 each comprises a single layer or a plurality of layers. For example, the first electrode 61, the second electrode 62, the first electrode pad 71, and/or the second electrode pad 72 comprises Ti/Au layers, Ti/Pt/Au layers, Cr/Au layers, Cr/Pt/Au layers, Ni/Au layers, Ni/Pt/Au layers, or Cr/Al/Cr/Ni/Au layers. The first electrode 61, the second electrode 62, the first electrode pad 71, and the second electrode pad 72 can be used as an electrical path for an external power source to supply current to the first semiconductor layer 21 and the second semiconductor layer 22. The first electrode 61, the second electrode 62, the first electrode pad 71, and/or the second electrode pad 72 comprises a thickness between 1 µm~100 µm, preferably between 1.2 µm~60 µm, more preferably between 1.5 µm~6 µm.

The material of the protective layer 50 and the insulating layer 51 each comprises a non-conductive material. The non-conductive material comprises organic material, inorganic material, or dielectric material. The organic material comprises Sub, benzocyclobutene (BCB), perfluorocyclobutane (PFCB), epoxy resin, acrylic resin, cycloolefin polymer (COC), polymethylmethacrylate ester (PMMA), polyethylene terephthalate (PET), polycarbonate (PC), polyetherimide, or fluorocarbon polymer. The inorganic material comprises silicone or glass. The dielectric material comprises aluminum oxide ($Al_2O_3$), silicon nitride ($SiN_x$), silicon oxide ($SiO_x$), silicon oxynitride ($SiO_xN_y$), titanium oxide ($TiO_x$), or magnesium fluoride ($MgF_x$). In an embodiment of the application, the protective layer 50 and/or the insulating layer 51 comprises a single layer structure. In an embodiment of the application, the protective layer 50 and/or the insulating layer 51 can be formed by a combination of the above-mentioned materials to form a multilayer structure, for example, by alternately stacking two or more materials with different refractive indices to form a reflective structure comprising a Distributed Bragg Reflector (DBR). The protective layer 50 and/or the insulating layer 51 each comprises a thickness between 0.5 µm and 4 µm, preferably comprises a thickness between 2.5 µm and 3.5 µm, and more preferably comprises a thickness between 2.7 µm and 3.3 µm.

In an embodiment, the protective layer 50 and/or the insulating layer 51 comprises a Distributed Bragg Reflector (DBR) structure, the protective layer 50 and/or the insulating layer 51 comprises a reflectivity more than 90% for a light comprising a peak wavelength k emitted from the semiconductor stack 20. When the light enters the protective layer 50 and/or the insulating layer 51 at a right angle or at various incident angles, the protective layer 50 and/or the insulating layer 51 both comprise good reflectivity to improve the light extraction efficiency.

In an embodiment, the protective layer 50 and/or the insulating layer 51 comprises a Distributed Bragg Reflector (DBR) structure, which comprises a plurality of regions, such as a first region and a second region. The first region is closest to the semiconductor stack 20, the second region is farther from the semiconductor stack 20 than the first region to the semiconductor stack 20, and the first region and the second region each comprises a plurality of layers. The plurality of layers of the first region and the second region is formed by alternately stacking films comprising two or more materials with different refractive indexes respectively. In an embodiment, the first region and the second region are formed by alternately stacking the third layer and the fourth layer comprising two materials respectively. The material of the third layer comprises a third refractive index (low refractive index), such as a $SiO_2$ layer (n: about 1.47), and the material of the fourth layer comprises a fourth refractive index (high refractive index), such as a $TiO_2$ layer (n: about 2.41). In an embodiment, the third layer and the fourth layer of the first region respectively comprises a third optical thickness and a fourth optical thickness, and the third optical thickness and the fourth optical thickness are respectively larger than $0.25\lambda$. The third layer and the fourth layer of the second region respectively comprises a third optical thickness and a fourth optical thickness, and the third optical thickness and the fourth optical thickness are respectively less than $0.25\lambda$. In an embodiment, there are another or more regions between the first region and the second region, such as the third region and the fourth region, and the third region is closer to the first region than the fourth region to the first region. The third region and the fourth region respectively comprise a plurality of layers. The plurality of layers of the third region and the fourth region is respectively formed by alternately stacking films comprising two or more materials with different refractive indexes. In an embodiment, similar to the first region and the second region, the third region and the fourth region are respectively formed by alternately stacking the third layer and the fourth layer comprising two materials. The material of the third layer comprises a third refractive index (low refractive index), such as a $SiO_2$ layer (n: about 1.47), and the material of the fourth layer comprises a fourth refractive index (high refractive index), such as a $TiO_2$ layer (n: about 2.41). In an embodiment, the third layer and the fourth layer of the third region respectively comprise a third optical thickness and a fourth optical thickness; the third layer and the fourth layer of the fourth region respectively comprise a third optical thickness and a fourth optical thickness. The third optical thickness and the fourth optical thickness of the third region and the fourth region are respectively less than the third optical thickness and the fourth optical thickness of the first region, larger than the third optical thickness and the fourth optical thickness of the second region, and the third optical thickness and the fourth optical thickness of the third region are larger than or equal to the third optical thickness and the fourth optical thickness of the fourth region. In an embodiment, the third optical thickness and the fourth optical thickness of the third region are respectively larger than 0.25λ, and the third optical thickness and the fourth optical thickness of the fourth region are respectively larger than 0.25λ. In an embodiment, the third optical thickness and the fourth optical thickness of the third region are respectively greater than 0.25λ, and the third optical thickness and the fourth optical thickness of the fourth region are respectively less than 0.25λ. In an embodiment, the third optical thickness and the fourth optical thickness of the third region are respectively less than 0.25λ, and the third optical thickness and the fourth optical thickness of the fourth region are respectively less than 0.25λ. In an embodiment, the third optical thickness and the fourth optical thickness of the third region are respectively equal to 0.25λ, and the third optical thickness and the fourth optical thickness of the fourth region are respectively equal to 0.25λ.

The optical thickness difference between two adjacent third layer and fourth layer of each region is less than 0.05λ, preferably less than 0.025λ, more preferably less than 0.01λ. The optical thickness is the product of the physical thickness and the refractive index (n) of the material of the layer.

The light field adjustment layer 30 is disposed on the main light emitting surface of the light-emitting device 1 to adjust the light field distribution of the light-emitting device 1 by reflecting the light propagating in a direction perpendicular to the main light emitting surface. The light field adjustment layer 30 comprises two or more materials with different refractive indexes alternately stacked to form a Distributed Bragg Reflector (DBR) structure, which selectively reflects the light of a specific wavelength and the light transmittance changes in accordance with the incident angle of the light.

The main light-emitting surface of the light-emitting device 1 is provided by the structure thereof, and the light can be emitted from a side of the substrate 10 or from a side of the first electrode 61 and the second electrode 62. When the light-emitting device 1 comprises a flip chip structure, as shown in FIG. 1, the light field adjustment layer 30 can be disposed on the first surface 101 of the substrate 10. When the light-emitting device 1 comprises a lateral chip structure, the light field adjustment layer 30 can be disposed between the semiconductor stack 20 and the first electrode 61, the second electrode 62 (not shown).

Figure 4:
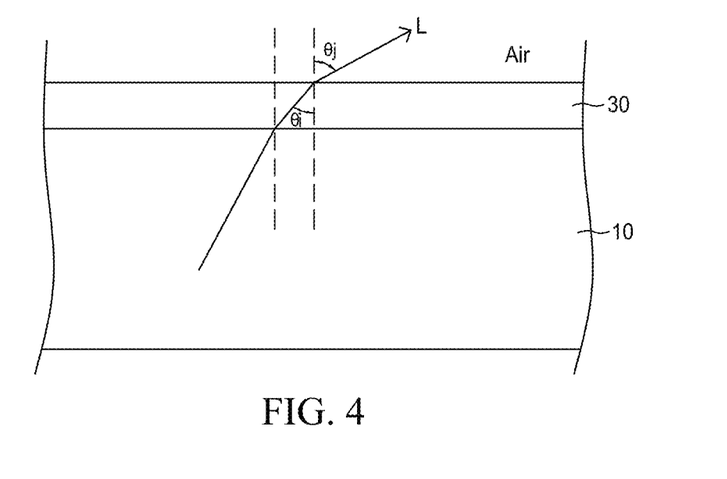
FIG. 4 illustrates a schematic diagram of the light propagation in accordance with an embodiment of the present application.

Referring to the light-emitting device 1 illustrated in FIG. 1, according to Snell's law, when the light L travels from the semiconductor stack 20 through the substrate 10, the light field adjustment layer 30, and emits out of the air, the refractive indexes of the material changes, so that the emergence angle θj of the light L traveling through the light field adjustment layer 30 is larger than the incident angle θi of the light L that enters the light field adjustment layer 30 due to the refractive index contrast between the light field adjustment layer 30 and the air ($n_{air}$:1) as indicated in FIG. 4.

Figure 5:
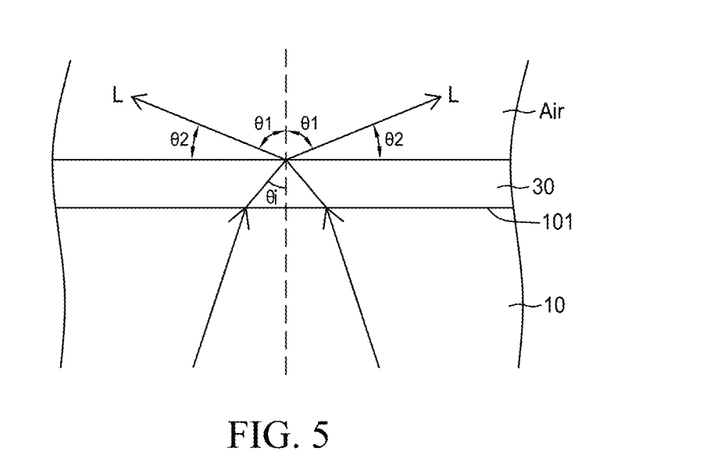
FIG. 5 illustrates a schematic diagram of the light propagation in accordance with an embodiment of the present application.
Figure 6:
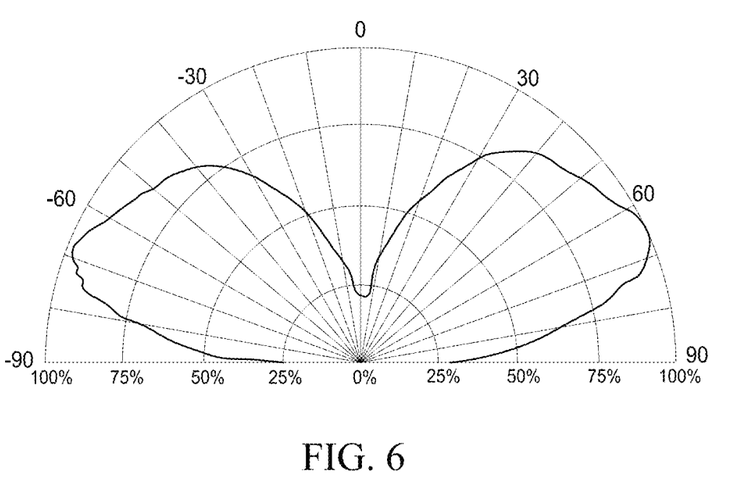
FIG. 6 illustrates a light field distribution diagram of the light-emitting device 1 in accordance with an embodiment of the present application.

Specifically, as shown in FIG. 5 and FIG. 6, when the light L enters the light field adjustment layer 30 at an incident angle smaller than θi and emits out the light field adjustment layer 30, a first light intensity is provided in the first area θ1. When the light L enters the light field adjustment layer 30 at an incident angle greater than θi and emits out the light field adjustment layer 30, a second light intensity is provided in the second area θ2. The light field adjustment layer 30 comprises a light transmittance less than 50% for the light entering thereof at an incident angle less than θi, thus the light-emitting device 1 comprises a bat-wing light field distribution.

As shown in FIG. 6, the transmittance of the light L is highest near the emergence angle between 60 degrees and 70 degrees, and an overall high transmittance is provided at the angle between 30 degrees and 80 degrees.

Figure 7:
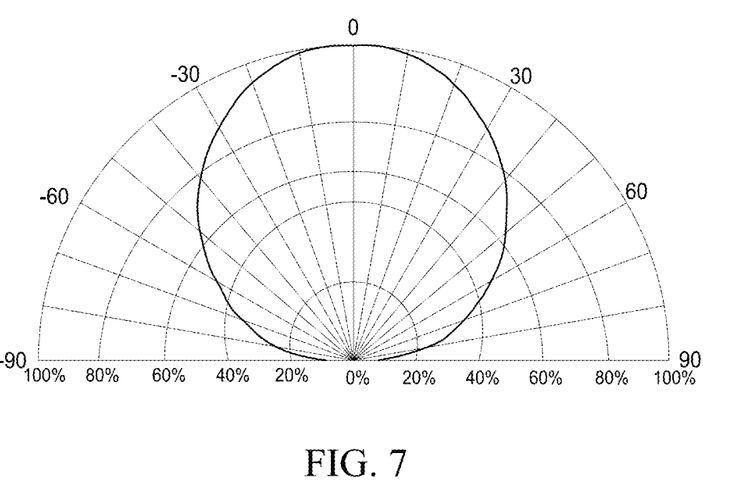
FIG. 7 illustrates a light field distribution diagram of a conventional light-emitting device.

FIG. 7 illustrates a light field distribution diagram having a Lambertian pattern of a conventional light-emitting device without the light field adjustment layer 30. Comparing with FIG. 7, FIG. 6 illustrates that the light amount of the light L between 0 degrees and 30 degrees is significantly reduced, and the light amount between 30 degrees and 90 degrees is relatively increased.

By replacing the optical structure of the lens with the light field adjustment layer 30, the optical distribution can be adjusted at the wafer level or on the wafer to avoid the additional use of the optical structure of the lens.

As shown in FIG. 3A, the light field adjustment layer 30 comprises two types of dielectric layers comprising different refractive indexes, such as a first layer 30a and a second layer 30b, alternately stacked for multiple times. As shown in FIG. 1, FIG. 3A, FIG. 5, and FIG. 6, the light distribution of the bat-wing light field can be adjusted by the light field adjustment layer 30 to reduce the light transmittance at an angle smaller than the specific incident angle θi and increase the light transmittance at an angle larger than the specific incident angle θi. For example, the light L comprises a first light entering the light field adjustment layer 30 at a first incident angle (not shown) and a second light entering the light field adjustment layer 30 at a second incident angle (not shown). When the second incident angle is larger than the specific incident angle θi and the first incident angle is less than the specific incident angle θi, the transmittance of the second light at the second incident angle is larger than the transmittance of the first light at the first incident angle, and the first light and the second light emit out the light field adjustment layer 30 which provide a bat-wing light field distribution.

In the embodiment, the transmittance of the light L at various incident angles is adjusted by selecting the refractive index, thickness T1 and T2, and the stack amount of the first layer 30a and the second layer 30b of the light field adjustment layer 30.

Specifically, the light field adjustment layer 30 is formed by repeatedly stacking the first layer 30a and the second layer 30b comprising different refractive indexes for 2-50 times. The thickness of the light field adjustment layer 30, that is, the sum of the first optical thickness T1 of the plurality of first layers 30a and the second optical thickness T2 of the plurality of second layers 30b can be set in the range of between 0.5 μm~5 μm, preferably between 1 μm~3 μm, more preferably between 1.5 μm~2 μm.

One of the first layer 30a and the second layer 30b of the light field adjustment layer 30 is a high refractive index layer, such as TiO$_x$, HfO$_2$, ZnO, La$_2$O$_3$, CeO$_2$, ZrO$_2$, ZnSe, Si$_3$N$_4$, Nb$_2$O$_5$, or Ta$_2$O$_5$, and another one of the first layer 30a and the second layer 30b of the light field adjustment layer 30 is a low refractive index layer, such as SiO$_2$, LaF$_3$, MgF$_2$, NaF, Na$_3$AlF$_6$, CaF$_2$, or AlF$_3$.

In an embodiment of the application, a first one layer and/or a last one layer of the light field adjustment layer 30 comprises TiO$_x$, HfO$_2$, ZnO, La$_2$O$_3$, CeO$_2$, ZrO$_2$, ZnSe, Si$_3$N$_4$, Nb$_2$O$_5$, or Ta$_2$O$_5$.

In another embodiment of the application, the first one layer and/or the last one layer of the light field adjustment layer 30 comprises SiO$_2$, LaF$_3$, MgF$_2$, NaF, Na$_3$AlF$_6$, CaF$_2$, or AlF$_3$.

In another embodiment of the application, the light field adjustment layer 30 further comprises a first starting layer (not shown) and a second starting layer (not shown) formed between the first layer 30a and the substrate 10 or between the second layer 30b and the substrate 10, wherein the first starting layer is a high refractive index layer, the second starting layer is a low refractive index layer, the optical thickness of the first starting layer and that of the second starting layer are both less than 0.25λ, and the first starting layer is closer to the substrate 10 or the semiconductor stack 20 than the second starting layer to the substrate 10 or the semiconductor stack 20.

For convenience of description, taking the first layer 30a of a high refractive index layer, such as TiO$_2$, and the second layer 30b of a low refractive index layer, such as SiO$_2$, as an example for description, but it is not intended to limit the disclosure of the present application. The light field adjustment layer 30 comprises a plurality of film regions. Each film region comprises a plurality of first layers 30a and a plurality of second layers 30b. The plurality of first layers 30a each comprises a first optical thickness and the plurality of second layers 30b each comprises a second optical thickness. The first optical thickness of the plurality of first layers 30a is variable and deviated from 0.25λ in each film region, and/or the second optical thickness of the plurality of second layers 30b is variable and deviated from 0.25λ in each film region. The variable trend of the first optical thickness of the plurality of first layers 30a and/or the second optical thickness of the plurality of second layers 30b in each film region can be changed irregularly or regularly, such as linearly, non-linearly, curved, or stepwise. In an example, the first optical thickness of the plurality of first layers 30a and the second optical thickness of the plurality of second layers 30b in each film region are both changed and deviated from 0.25λ. In one embodiment, the trend of these first optical thicknesses is decreased first and then is increased, or is increased first and then is decreased. The trend of these second optical thicknesses is decreased first and then is increased, or is increased first and then is decreased. In another example, only one of the first optical thickness of the plurality of first layers 30a and the second optical thickness of the plurality of second layers 30b in each film region is changed and deviated from 0.25λ. For example, when one of the first layer 30a and the second layer 30b in one film region is deviated from 0.25λ of optical thickness, the other one of the first layer 30a and the second layer 30b in the same film region has an optical thickness substantially the same with those of other layers which is 0.25λ. The optical thickness of at least one of the plurality of first layers 30a in each film region is deviated from 0.25λ. Preferably, the optical thicknesses of at least two of the plurality of first layers 30a in each film region are varied from each other and deviated from 0.25λ. More preferably, the optical thicknesses of all of the plurality of first layers 30a in each film region are varied and deviated from 0.25λ. The optical thickness difference between the two adjacent first layer and second layer in each film region is larger than 0.01λ, better larger than 0.025λ, preferably larger than 0.05λ, and more preferably larger than 0.1λ. The optical thickness is the product of the physical thickness and the refractive index (n) of the layer. It will be described below in detail according to different embodiments.

Figure 8A:
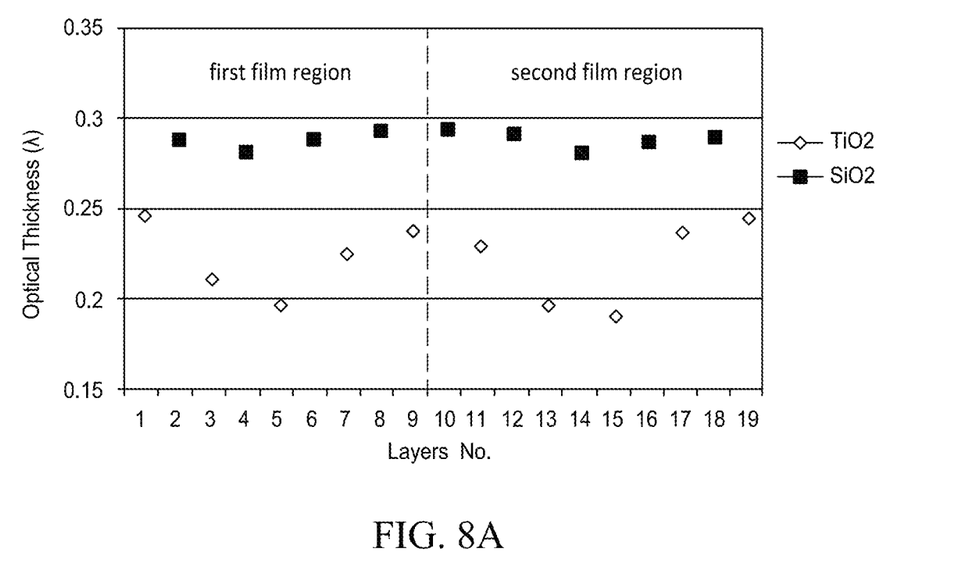
FIG. 8A~FIG. 8B illustrate diagrams of the optical thickness variation of the light field adjustment layer 30 in accordance with an embodiment of the present application.
Figure 8B:
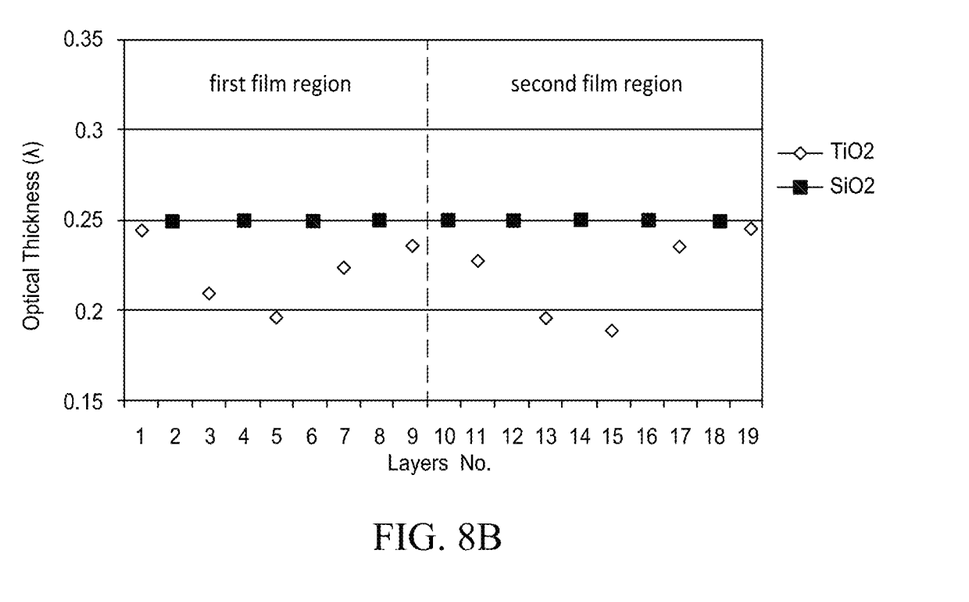

In an embodiment of the application, the light field adjustment layer 30 comprises a first film region and a second film region in the thickness direction. The first film region is closer to the substrate 10 or the semiconductor stack 20 than the second film region to the substrate 10 or the semiconductor stack 20. The plurality of first layers 30a and the plurality of second layers 30b located in the first film region are alternately stacked on top of each other, and the plurality of first layers 30a and the plurality of second layers 30b located in the second film region are alternately stacked on top of each other. The plurality of first layers 30a of the light field adjustment layer 30 comprises a first optical thickness less than 0.25λ, and the plurality of second layers 30b of the light field adjustment layer 30 comprises a second optical thickness larger than or substantially equal to 0.25λ. As shown in FIG. 1, FIG. 3A, and FIG. 8A~FIG. 8B, when the peak wavelength of the light L emitted from the active layer 23 is λ, the plurality of first layers 30a of the light field adjustment layer 30 each comprises a first optical thickness T1 less than 0.25λ but larger than 0.15λ. As shown in FIG. 3A and FIG. 8A, taking the first layer 30a of the high refractive index layer, such as TiO$_2$, and the second layer 30b of the low refractive index layer, such as SiO$_2$, as an example for description, but it is not intended to limit the disclosure of the present application. The plurality of second layers 30b of the light field adjustment layer 30 each comprises a second optical thickness T2 larger than 0.25λ but less than 0.35λ. Or, as shown in FIG. 3A and FIG. 8B, the plurality of second layers 30b each comprises a second optical thickness T2 between 0.25λ+/−0.025λ. Under each of the above conditions, the first optical thickness of the plurality of first layers 30a or the second optical thickness of the plurality of second layers 30b in each film region can be changed irregularly or regularly, such as linearly, non-linearly, curved, or stepwise. As shown in FIG. 8A~FIG. 8B, the first optical thickness of the plurality of first layers 30a is decreased first and then is increased, and/or the second optical thickness of the plurality of second layers 30b is decreased first and then is increased; or the first optical thickness of the plurality of first layers 30a is first decreased and then is increased, and/or the second optical thickness of the plurality of second layers 30b is increased first and then is decreased. In an embodiment, the first optical thickness of the plurality of first layers 30a is increased first and then is decreased (not shown), and/or the second optical thickness of the plurality of second layers 30b is decreased first and then is increased or is increased first and then is decreased (not shown). In an embodiment, the first optical thickness of the plurality of first layers 30a can be less than 0.25λ but larger than 0.15λ, and keeps a thickness difference within 10% (not shown), and/or the second optical thickness of the plurality of second layers 30b can be larger than 0.25λ but less than 0.35λ, and keeps a thickness difference within 10% (not shown).

The first optical thickness difference between any two of the first layers 30a of the first film region can be less than or larger than the first optical thickness difference between any two of the first layers 30a of the second film region, and/or the second optical thickness difference between any two of the second layers 30b of the first film region can be less or larger than the second optical thickness difference between any two of the second layers 30b of the second film region. The first optical thickness difference can be the difference between the maximum value and the minimum value of the first optical thickness of the plurality of first layers 30a. The second optical thickness difference can be the difference between the maximum value and the minimum value of the second optical thickness of the plurality of second layers 30b. In the embodiment, the first optical thickness difference is between 0.025λ and 0.1λ. When the second optical thickness T2 is larger than 0.25λ, the second optical thickness difference is between 0.025λ and 0.1λ. When the second optical thickness T2 is substantially equal to 0.25λ, the second optical thickness difference is less than 0.025λ.

Figure 9A:
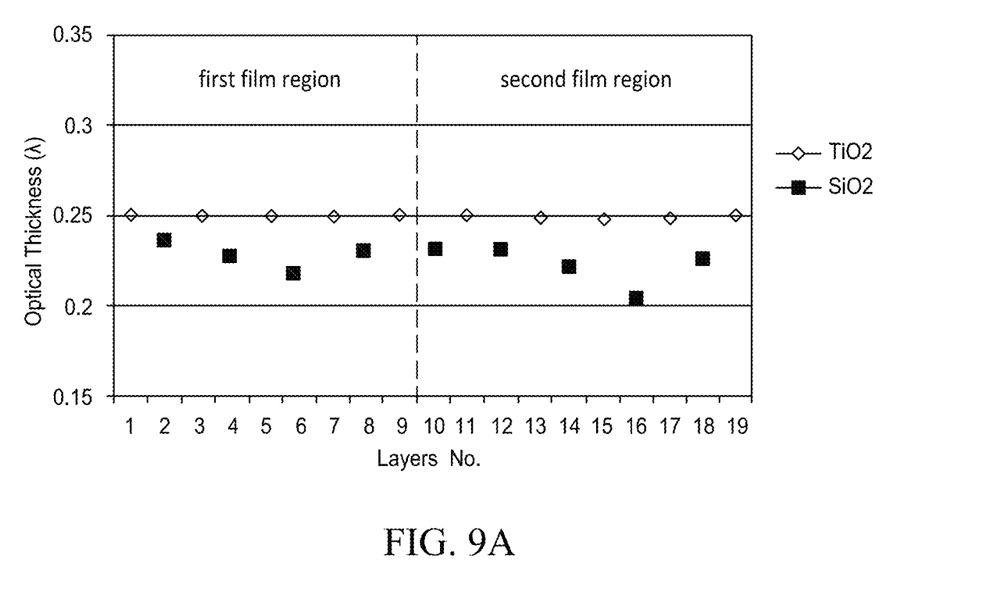
FIG. 9A~FIG. 9B illustrate diagrams of the optical thickness variation of the light field adjustment layer 30 in accordance with an embodiment of the present application.
Figure 9B:
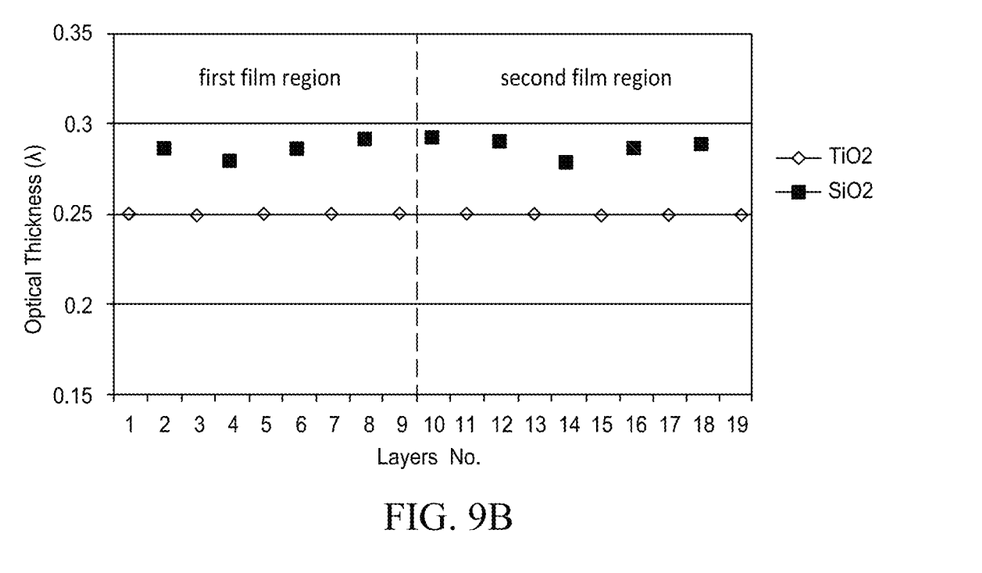

In another embodiment of the application, the first layer 30a of the light field adjustment layer 30 comprises a first optical thickness substantially equal to 0.25λ and the second layer 30b of the light field adjustment layer 30 comprises a second optical thickness less than or larger than 0.25λ. As shown in FIG. 1, FIG. 3A, and FIG. 9A~FIG. 9B, when the peak wavelength of the light L emitted from the active layer 23 is λ, the first layer 30a of the light field adjustment layer 30 comprises a first optical thickness T1 between 0.25λ+/−0.025λ. As shown in FIG. FIGS. 3A and 9A, taking the first layer 30a of the high refractive index layer, such as TiO₂, and the second layer 30b of the low refractive index layer, such as SiO₂, as an example for description, but it is not intended to limit the disclosure of the present application. The second layer 30b comprises a second optical thickness T2 less than 0.25λ but larger than 0.15λ. As shown in FIG. 3A and FIG. 9B, taking the first layer 30a of the high refractive index layer, such as TiO₂, and the second layer 30b of the low refractive index layer, such as SiO₂, as an example for description, but it is not intended to limit the disclosure of the present application. The second layer 30b comprises a second optical thickness T2 larger than 0.25λ but less than 0.35λ. Under each of the above conditions, the second optical thickness of the plurality of second layers 30b in each film region can be changed irregularly or regularly, such as linearly, non-linearly, curved, or stepwise. As shown in FIG. 9A and FIG. 9B, the second optical thickness of the plurality of second layers 30b is decreased first and then is increased, is increased first and then is decreased (not shown), or keeps the thickness difference within 10% (not shown), while the first optical thicknesses of the plurality of first layers 30a is substantially the same. The second optical thickness difference between any two of the second layers 30b of the first film region can be less or larger than the second optical thickness difference between any two of the second layers 30b of the second film region. The second optical thickness difference can be the difference between the maximum value and the minimum value of the second optical thickness of the plurality of second layers 30b. In the embodiment, when the second optical thickness T2 is less than 0.25λ, the second optical thickness difference is between 0.025λ and 0.1λ. When the second optical thickness T2 is larger than 0.25λ, the second optical thickness difference is between 0.025λ and 0.1λ.

Figure 10A:
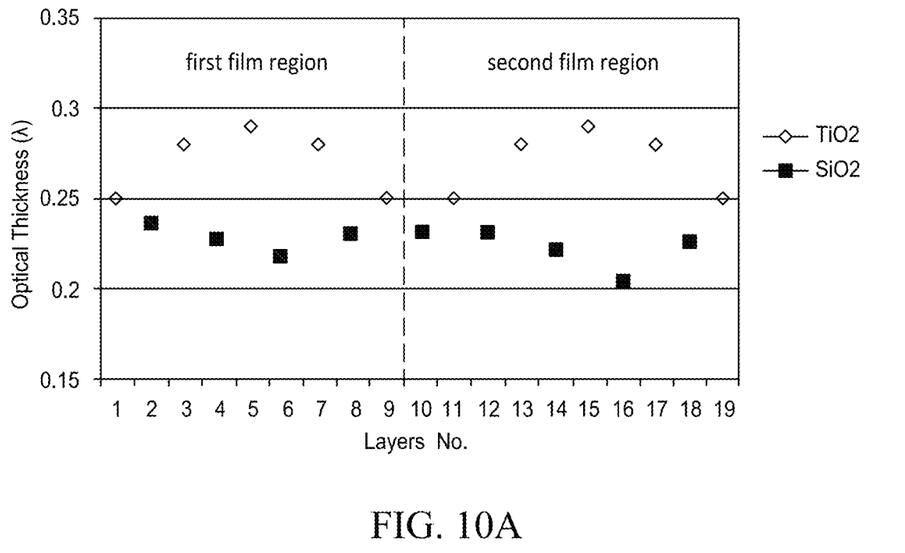
FIG. 10A~FIG. 10B illustrate diagrams of the optical thickness variation of the light field adjustment layer 30 in accordance with an embodiment of the present application.
Figure 10B:
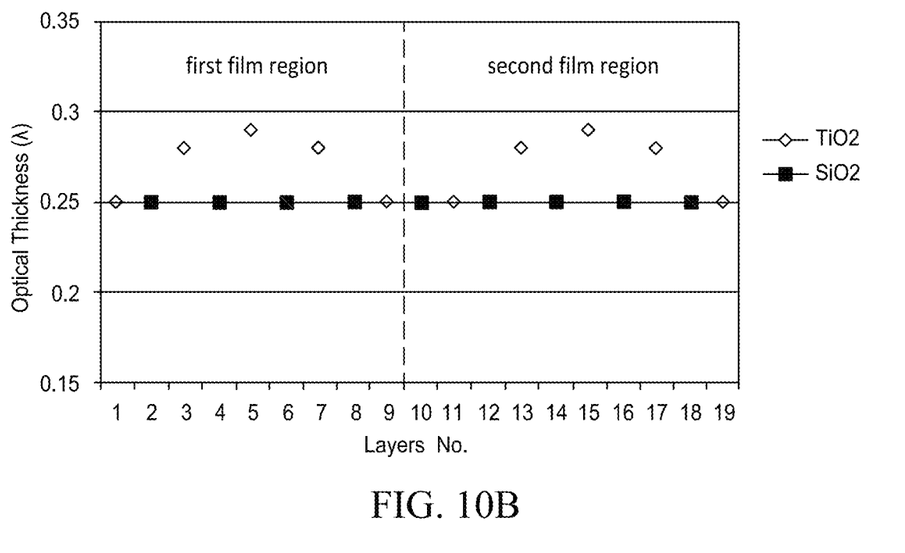

In another embodiment of the application, the first layer 30a of the light field adjustment layer 30 comprises a first optical thickness larger than 0.25λ and the second layer 30b of the light field adjustment layer 30 comprises a second optical thickness less than or substantially equal to 0.25λ. As shown in FIG. 1, FIG. 3A, and FIG. 10A~FIG. 10B, when the peak wavelength of the light L emitted from the active layer 23 is k, the first layer 30a of the light field adjustment layer 30 comprises a first optical thickness T1 larger than 0.25λ but less than 0.35λ. As shown in FIG. 3A and FIG. 10A, taking the first layer 30a of the high refractive index layer, such as TiO₂, and the second layer 30b of the low refractive index layer, such as SiO₂, as an example for description, but it is not intended to limit the disclosure of the present application. The second layer 30b comprises a second optical thickness T2 less than 0.25λ but larger than 0.15λ, or as shown in FIG. 3A and FIG. 10B, taking the first layer 30a of the high refractive index layer, such as TiO₂, and the second layer 30b of the low refractive index layer, such as SiO₂, as an example for description, but it is not intended to limit the disclosure of the present application. The second optical thickness T2 is between 0.25λ+/−0.025λ. Under each of the above conditions, the first optical thickness of the plurality of first layers 30a or the second optical thickness of the plurality of second layers 30b in each film region can be changed irregularly or regularly, such as linearly, non-linearly, curved, or stepwise. For example, the first optical thickness of the plurality of first layers 30a is decreased first and then is increased, and/or the second optical thickness of the plurality of second layers 30b is decreased first and then is increased; or the first optical thickness of the plurality of first layers 30a is decreased first and then is increased, and/or the second optical thickness of the plurality of second layers 30b is increased first and then is decreased. In an embodiment, the first optical thickness of the plurality of first layers 30a is increased first and then is decreased, and/or the second optical thickness of the plurality of second layers 30b is decreased first and then is increased, or is increased first and then is decreased. In an embodiment, the first optical thickness of the plurality of first layers 30a can be larger than 0.25λ but less than 0.35λ, and keeps a thickness difference within 10% (not shown), and/or the second optical thickness of the plurality of second layers 30b can be less than 0.25λ but larger than 0.15λ, and keeps the thickness difference within 10% (not shown). The first optical thickness difference between any two of first layers 30a of the first film region can be less than or larger than the first optical thickness difference between any two of first layers 30a of the second film region, and/or the second optical thickness difference between any two of second layers 30b of the first film region can be less than or larger than the second optical thickness difference between any two of second layers 30b of the second film region. The first optical thickness difference can be the difference between the maximum value and the minimum value of the first optical thickness of the plurality of first layers 30a. The second optical thickness difference can be the difference between the maximum value and the minimum value of the second optical thickness of the plurality of second layers 30b. In the embodiment, the first optical thickness difference is between 0.025λ and 0.1λ. When the second optical thickness T2 is less than 0.25λ, the second optical thickness difference is between 0.025λ and 0.1λ. When the second optical thickness T2 is substantially equal to 0.25λ, the second optical thickness difference is less than 0.025λ.

Figure 11:
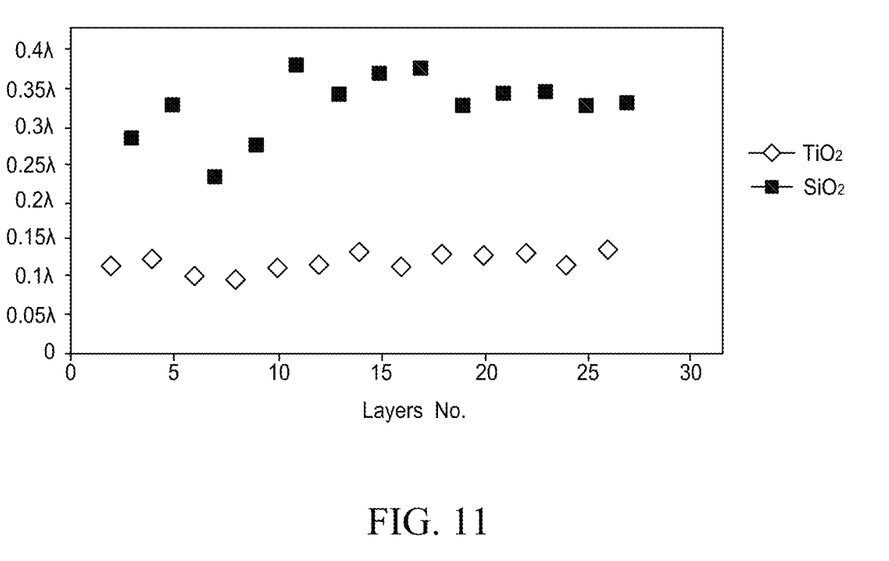
FIG. 11 illustrates a diagram of the optical thickness variation of the light field adjustment layer 30 in accordance with an embodiment of the present application.

In another embodiment of the application, as shown in FIG. 1, FIG. 3A, and FIG. 11, taking the first layer 30a of the high refractive index layer, such as $TiO_2$, and the second layer $30b$ of the low refractive index layer, such as $SiO_2$, as an example for description, but it is not intended to limit the disclosure of the present application. When the peak wavelength of the light L emitted from the active layer 23 is λ, the first layer $30a$ of the light field adjustment layer 30 comprises a first optical thickness less than 0.25λ, more preferably less than 0.2λ, but larger than 0.05λ. The second layer $30b$ of the light field adjustment layer 30 comprises a second optical thickness larger than or substantially equal to 0.25λ, but less than 0.4λ. Under each of the above conditions, the first optical thickness of the plurality of first layers $30a$ or the second optical thickness of the plurality of second layers $30b$ can be changed irregularly or regularly, such as linearly, non-linearly, curved, or stepwise. The second optical thickness of the plurality of second layers $30b$ and the first optical thickness of the plurality of first layers $30a$ comprise a ratio larger than 2.5. In the embodiment, the first optical thickness difference is larger than 0.025λ but less than 0.1λ, and the second optical thickness difference is larger than 0.005λ but less than 0.25λ. The second optical thickness difference of the plurality of second layers $30b$ is larger than the first optical thickness of the plurality of first layers $30a$. The first optical thickness difference can be the difference between the maximum value and the minimum value of the first optical thickness of the plurality of first layers $30a$. The second optical thickness difference can be the difference between the maximum value and the minimum value of the second optical thickness of the plurality of second layers $30b$. In the embodiment, the light field adjustment layer 30 comprises a single film region, and the optical thickness is the product of the physical thickness and the refractive index (n) of the layer.

FIG. 3B illustrates a schematic diagram of the structure of the light field adjustment layer 30 in accordance with another embodiment of the present application. As shown in FIG. 1 and FIG. 3B, the first layer $30a$ of the light field adjustment layer 30 comprises a first optical thickness between 0.25+/−0.025λ, and the second layer $30b$ comprises a second optical thickness between 0.25+/−0.025λ.

The light field adjustment layer 30 comprises a first film region and a second film region in the thickness direction. The first film region is closer to the substrate 10 or the semiconductor stack 20 than the second film region to the substrate 10 or the semiconductor stack 20. The plurality of first layers $30a$ and the plurality of second layers $30b$ located in the first film region are alternately stacked on top of each other, and the plurality of first layers $30a$ and the plurality of second layers $30b$ located in the second film region are alternately stacked on top of each other. The first optical thickness difference between any two of first layers $30a$ of the first film region is substantially equal to the first optical thickness difference between any two of first layers $30a$ of the second film region, and/or the second optical thickness difference between any two of second layers $30b$ of the first film region is substantially equal to the second optical thickness difference between any two of second layers $30b$ of the second film region. In the embodiment, the first optical thickness difference is less than 0.025λ and/or the second optical thickness difference is less than 0.025λ.

In this embodiment, the light field adjustment layer 30 comprises a space layer $30c$ located between two adjacent first layers $30a$ or between two adjacent second layers $30b$, wherein the space layer $30c$ comprises an optical thickness even multiple of 0.25+/−0.025λ, such as 0.5+/−0.05λ or 1+/−0.1λ.

In an embodiment of the application, the first layer $30a$ of the light field adjustment layer 30 is a high refractive index layer, such as $TiO_x$, $HfO_2$, ZnO, $La_2O_3$, $CeO_2$, $ZrO_2$, ZnSe, $Si_3N_4$, $Nb_2O_5$, or $Ta_2O_5$, and the second layer $30b$ of the light field adjustment layer 30 is a low refractive index layer, such as $SiO_2$, $LaF_3$, $MgF_2$, NaF, $Na_3AlF_6$, $CaF_2$, or $AlF_3$. If the space layer $30c$ is located between two adjacent first layers $30a$, the space layer $30c$ comprises $SiO_2$, $LaF_3$, $MgF_2$, NaF, $Na_3AlF_6$, $CaF_2$, or $AlF_3$. If the space layer $30c$ is located between two adjacent second layers $30b$, the space layer $30c$ comprises $TiO_x$, $HfO_2$, ZnO, $La_2O_3$, $CeO_2$, $ZrO_2$, ZnSe, $Si_3N_4$, $Nb_2O_5$, or $Ta_2O_5$.

Electron beam evaporation, chemical vapor deposition (CVD), plasma-assisted chemical vapor deposition (PECVD), or atomic vapor deposition is provided to form the light field adjustment layer 30 to stably control the thickness of each layer of the Distributed Bragg Reflector (DBR) structure.

In the technical field of displays, the light source is usually changed from Lambertian type to bat-wing type through the secondary optical elements to achieve higher light uniformity. It is more important for the mini LED to be applied in the direct light source of the display. Because of the high directivity of the LED, if the LED is used as the direct light source of the display, the additional diffusers or the secondary optical elements are required. The present application achieves a better uniform light design through the DBR structure and controlling the light emission angle, so as to save the cost and reduce the thickness of the diffuser and the secondary optical element, the display can be cheaper and thinner, and various light types can be provided through the technology.

Figure 12:
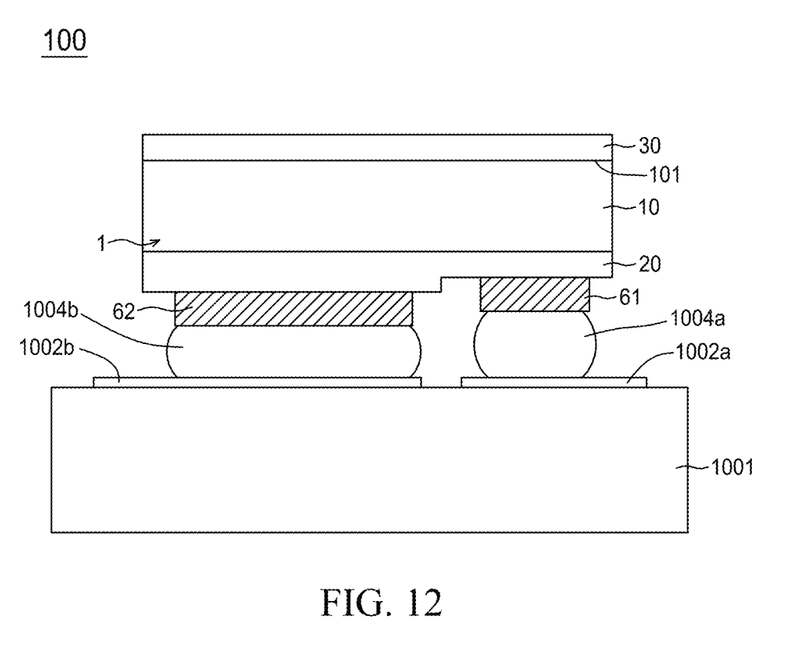
FIG. 12 illustrates a schematic diagram of a light-emitting apparatus 100 in accordance with an embodiment of the present application.

FIG. 12 illustrates a schematic diagram of a light-emitting apparatus 100 in accordance with an embodiment of the present application. As shown in FIG. 12, the light-emitting apparatus 100 comprises a circuit board 1001 and a light-emitting device 1 disposed on the circuit board 1001. The circuit board 1001 comprises a first external electrode $1002a$ and a second external electrode $1002b$. The first electrode 61 and the second electrode 62 of the light emitting device 1 or the first electrode pad 71 and the second electrode pad 72 of the light emitting device 1 (not shown) can be electrically connected to the first external electrode $1002a$ and the second external electrode $1002b$ through a first welding portion $1004a$ and a second welding portion $1004b$ respectively.

The circuit board 1001 comprises an insulating resin board, a ceramic board, or a metal board, such as a printed circuit board (PCB), a metal core printed circuit board (MCPCB), a metal printed circuit board (MPCB), or a flexible printed circuit board (FPCB).

In this embodiment, the first surface 101 of the substrate 10 is the main light emitting surface, and the light field adjustment layer 30 is disposed on the first surface 101 of the substrate 10.

Figure 13:
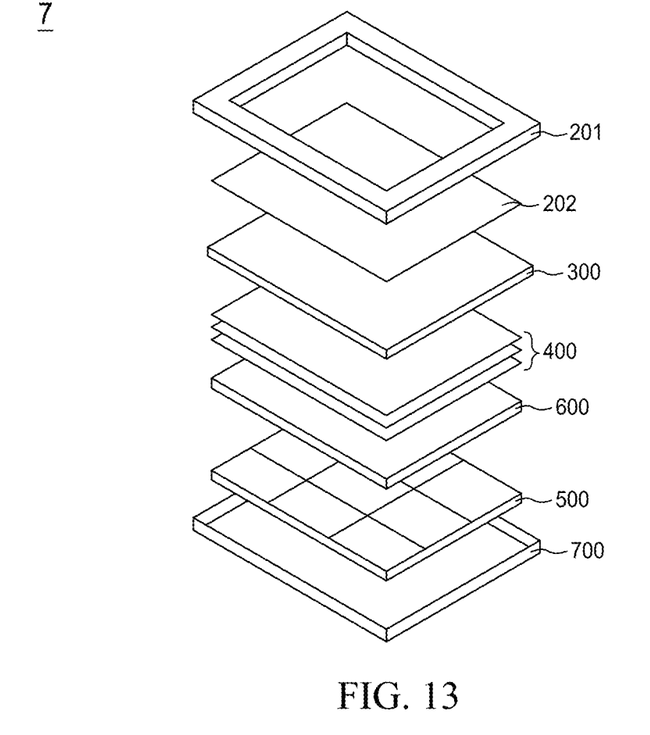
FIG. 13 illustrates a schematic diagram of a backlight module 7 in accordance with an embodiment of the present application.

FIG. 13 illustrates a schematic diagram of a backlight module 7 in accordance with an embodiment of the present application. The backlight module 7 comprises a first frame 201; a liquid crystal display 202; a brightness enhancement film 300; an optical module 400; a light-emitting module assembly 500; and a second frame 700, wherein the light-emitting module assembly 500 comprises a plurality of the light emitting devices 1 or light emitting apparatuses 100 described above, which is arranged in the light-emitting module assembly 500 in edge type or direct type. In another embodiment of the application, the backlight module 7 further comprises a wavelength conversion structure 600 disposed on the light-emitting module assembly 500.

Figure 14:
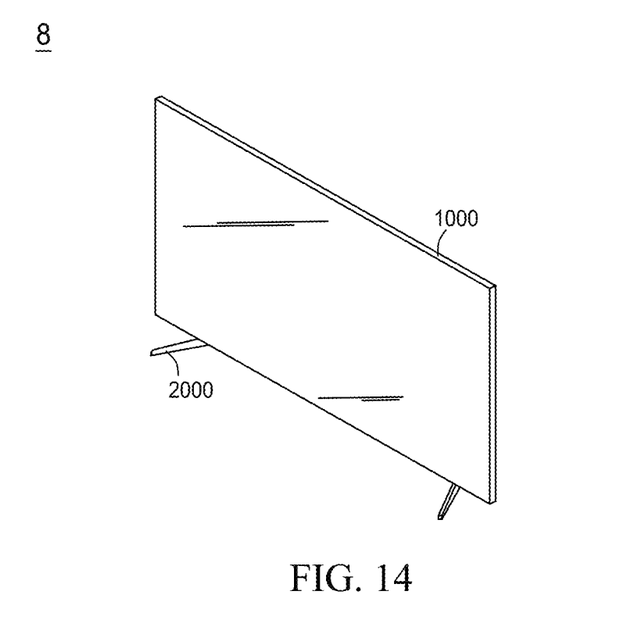
FIG. 14 illustrates a schematic diagram of a display 8 in accordance with an embodiment of the present application.

FIG. 14 illustrates a schematic diagram of a display 8 in accordance with an embodiment of the present application. The display 8 comprises a LED panel 1000; a current source (not shown); and a bracket 2000 supporting the LED panel 1000, wherein the LED panel 1000 comprises a plurality of light-emitting devices 1 or light-emitting apparatuses 100 described above. The LED panel 1000 comprises a plurality of pixels, the pixel comprises a plurality of light-emitting devices or light-emitting apparatuses emitting different colors, for example, each pixel comprises three light-emitting devices respectively emitting the red light, the green light, and the blue light.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, comprising:
a semiconductor stack emitting a light with a peak wavelength; and
a light field adjustment layer formed on the semiconductor stack, wherein the light field adjustment layer comprises a plurality of first layers and a plurality of second layers alternately stacked on top of each other, the plurality of first layers each comprises a first optical thickness, and the plurality of second layers each comprises a second optical thickness,
wherein the first optical thickness and the second optical thickness meet any one of the following:
the first optical thickness is less than 0.25 A, and the second optical thickness is larger than or approximately equal to 0.25 A,
the first optical thickness is equal to 0.25 A, and the second optical thickness is less than or larger than 0.25 A, or
the first optical thickness is larger than 0.25 A, and the second optical thickness is less than or approximately equal to 0.25 A,
wherein the light field adjustment layer comprises a first film region and a second film region, and a first optical thickness difference between any two of the plurality of first layers located in the first film region is larger than the first optical thickness difference between any two of the plurality of first layers located in the second film region,
wherein the first film region is closer to the semiconductor stack than the second film region to the semiconductor stack.

2. The light-emitting device according to claim 1, wherein the first optical thickness of the plurality of first layers is decreased first and then is increased.

3. The light-emitting device according to claim 2, wherein the second optical thickness of the plurality of second layers is decreased first and then is increased.

4. The light-emitting device according to claim 2, wherein the second optical thickness of the plurality of second layers is increased first and then is decreased.

5. The light-emitting device according to claim 1, wherein the first optical thickness of the plurality of first layers is increased first and then is decreased.

6. The light-emitting device according to claim 5, wherein the second optical thickness of the plurality of second layers is decreased first and then is increased.

7. The light-emitting device according to claim 5, wherein the second optical thickness of the plurality of second layers is increased first and then is decreased.

8. The light-emitting device according to claim 1, wherein the plurality of first layers comprises $TiO_x$, $HfO_2$, $ZnO$, $La_2O_3$, $CeO_2$, $ZrO_2$, $ZnSe$, $Si_3N_4$, $Nb_2O_5$, or $Ta_2O_5$, and the plurality of second layers comprises $SiO_2$, $LaF_3$, $MgF_2$, $NaF$, $NasAlF_6$, $CaF_2$, or $AlF_3$.

9. The light-emitting device according to claim 1, wherein the light-emitting device comprises a bat-wing light field distribution.

10. The light-emitting device according to claim 1, wherein an optical thickness difference between two adjacent first layer and second layer is larger than $0.025\lambda$.

11. The light-emitting device according to claim 1, further comprising a substrate and a protective layer covering the semiconductor stack, wherein the semiconductor stack is located on the substrate, the light field adjustment layer is located on the substrate, and the protective layer comprises a Distributed Bragg Reflector (DBR) structure.

12. The light-emitting device according to claim 11, wherein the Distributed Bragg Reflector (DBR) structure is formed by alternately stacking a third layer and the fourth layer, and an optical thickness difference between the third layer and the fourth layer is less than $0.05\lambda$.

13. The light-emitting device according to claim 12, wherein the optical thickness difference between the third layer and the fourth layer is less than $0.025\lambda$.

14. The light-emitting device according to claim 1, wherein a sum of the first optical thickness of the plurality of first layers and the second optical thickness of the plurality of second layers is between 1.5 µm~2 µm.

15. The light-emitting device according to claim 1, wherein the second optical thickness of the plurality of second layers and the first optical thickness of the plurality of first layers comprise a ratio larger than 2.5.

* * * * *